(12) United States Patent
Nakajima et al.

(10) Patent No.: US 8,278,880 B2
(45) Date of Patent: Oct. 2, 2012

(54) PORTABLE ELECTRONIC APPARATUS

(75) Inventors: Masayoshi Nakajima, Yokohama (JP); Takashi Ito, Yokohama (JP)

(73) Assignee: Kyocera Corporation, Kyoto (JP)

( * ) Notice: Subject to any disclaimer, the term of this patent is extended or adjusted under 35 U.S.C. 154(b) by 443 days.

(21) Appl. No.: 12/516,168

(22) PCT Filed: Nov. 22, 2007

(86) PCT No.: PCT/JP2007/072687
§ 371 (c)(1),
(2), (4) Date: Oct. 12, 2009

(87) PCT Pub. No.: WO2008/062879
PCT Pub. Date: May 29, 2008

(65) Prior Publication Data
US 2010/0072952 A1    Mar. 25, 2010

(30) Foreign Application Priority Data
Nov. 22, 2006   (JP) ................................. 2006-316251

(51) Int. Cl.
*H02J 7/04* (2006.01)
*H05K 7/20* (2006.01)
(52) U.S. Cl. .......... 320/150; 361/709; 361/714; 361/720
(58) Field of Classification Search .................... 320/150
See application file for complete search history.

(56) References Cited

U.S. PATENT DOCUMENTS

| | | | | |
|---|---|---|---|---|
| 6,125,038 A | * | 9/2000 | Amaro et al. | 361/704 |
| 6,154,367 A | * | 11/2000 | Pavlovic | 361/707 |
| 7,336,494 B2 | * | 2/2008 | Nishimura et al. | 361/714 |
| 2003/0108780 A1 | * | 6/2003 | Iwaizono et al. | 429/7 |
| 2004/0069046 A1 | * | 4/2004 | Sunshine et al. | 73/23.34 |
| 2005/0164080 A1 | * | 7/2005 | Kozu et al. | 429/176 |
| 2006/0145885 A1 | * | 7/2006 | Goulis et al. | 340/691.6 |
| 2007/0042232 A1 | * | 2/2007 | Takeshita et al. | 429/1 |

FOREIGN PATENT DOCUMENTS

| | | |
|---|---|---|
| JP | 2-262724 | 10/1990 |
| JP | 2003-060369 | 2/2003 |
| JP | 2005-183991 | 7/2005 |
| JP | 2005-244493 | 9/2005 |
| JP | 2006-185782 | 7/2006 |

OTHER PUBLICATIONS

International Search Report for PCT/JP2007/072687, mailed on Feb. 12, 2008, 4 pages.
Written Opinion of the International Searching Authority for PCT/JP2007/072687, mailed on Feb. 12, 2008, 6 pages.
JP Office Action and English translation, for JP Patent Application No. 2006-316251, dated Jun. 19, 2012.

* cited by examiner

*Primary Examiner* — M'Baye Diao
(74) *Attorney, Agent, or Firm* — Duane Morris LLP; Richard C. Kim

(57) ABSTRACT

To provide a structure to dissipate heat from an internal heating component efficiently for a miniaturized, thin portable electronic apparatus. The portable electronic apparatus comprises a housing 1, a circuit board 7 accommodated in the housing and mounted with an electronic component on a surface on one side of the circuit board, a thermally conductive member 6 arranged opposite to the surface on one side of the circuit board and having thermal conductive property, and a battery accommodated in a battery chamber 8 formed in the housing. The thermally conductive member 6 forms at least a part of the battery chamber 8.

10 Claims, 6 Drawing Sheets

PORTABLE ELECTRONIC APPARATUS

CROSS-REFERENCE TO RELATED APPLICATIONS

This application is a U.S. National Phase of International Patent Application No. PCT/JP2007/072687 filed Nov. 22, 2007, which claims priority to Japanese Patent Application No. 2006-316251 filed Nov. 22, 2006, the disclosures of which are herein incorporated by reference in their entirety.

TECHNICAL FIELD

The present invention is related to a portable electronic apparatus.

BACKGROUND ART

A portable electronic apparatus such as a cellular phone or a PDA (Personal Digital Assistant) as a typical example tends to have the increased number of components, among others, heating components, as the functionality is increasingly enhanced, and a housing of the portable electronic apparatus can be locally heated by the heating components. Particularly, in a portable electronic apparatus, heat from a heating component tends to stay inside. Thus, if the housing is locally heated, the heat from the heating component is transferred to user's hand or face during use, which gives the user of the apparatus an unpleasant feeling. Thus, it is necessary to dissipate the heat from the heating component efficiently outside to enhance the functionality of the portable electronic apparatus.

Conventionally, the heat from the heating component within an apparatus is dissipated, for example, through a shield frame for supporting a circuit board, or an internal space. However, it is difficult to ensure a conventional heat dissipation route in the portable electronic apparatus described above.

In this regard it is suggested in Patent Document 1 to attach a hand strap to a heat sink, which is mounted on the surface of an electronic component, by a pin and dissipate the heat outside of the housing from the hand strap. However, the hand strap is essentially required and there are many points to be improved.

Document 1: Japanese Patent Laid-Open No. 2005244493

SUMMARY OF THE INVENTION

Problems to be Solved by the Invention

Thus, the present invention is aimed at suggesting a structure for dissipating heat from an internal heating component in a portable electronic apparatus.

Means to Solve the Problems

To solve the above mentioned problems, the portable electronic apparatus of the present invention comprises a housing, a circuit board accommodated in the housing and mounted with an electronic component on one surface on one side, a thermally conductive member arranged opposite to the surface on one side of the circuit board and having thermally conductive property, and a battery accommodated in a battery chamber formed in the housing, wherein the thermally conductive member forms at least a part of the battery chamber.

In the portable electronic apparatus according to an embodiment, the thermally conductive member is preferably arranged opposite to the surface on one side of the circuit board and is formed by a covering member for covering the electronic component.

Further, according to another embodiment of a portable electronic apparatus, the covering member preferably has electric conductivity, and is electrically connected with a reference potential part arranged on the circuit board.

According to another embodiment of the portable electronic apparatus, the thermally conductive member is preferably contacted with the electronic component mounted on the surface on one side of the circuit board According to another embodiment of the portable electronic apparatus, preferably, a rib is formed on the thermally conductive member, such that it surrounds the electronic component mounted on the surface on one side of the circuit board.

According to another embodiment of the portable electronic apparatus, the circuit board preferably has an electronic component mounted on a surface on the other side opposite to the surface on one side, and the thermally conductive member has a thermally conductive part that is arranged opposite to the electronic component mounted on the surface on the other side of the circuit board.

According to another embodiment of the portable electronic apparatus, the battery is preferably arranged opposite to the thermally conductive member on a side where the circuit board is arranged opposed to the thermally conductive member.

According to another embodiment of the portable electronic apparatus, the thermally conductive member preferably has a planar face arranged opposite to the circuit board, and the battery is arranged adjacent to the circuit board in a direction of the planer face.

According to another embodiment of the portable electronic apparatus, the circuit board preferably has a plurality of electronic components mounted on the surface on one side, and a electronic component with relatively high heating property among the plurality of electronic components is arranged closer to the battery relative to the other electronic component on the surface on one side of the circuit board.

According to another embodiment, preferably, preferably, a portable electronic apparatus further comprises a charge control unit for controlling a charge of the battery and a temperature detection unit for detecting temperature of the battery or temperature near the battery, and, if the temperature detected by the temperature detection unit is not less than a predetermined temperature, the charge control unit performs control to inhibit the charge of the battery.

According to another embodiment, preferably, the portable electronic apparatus further comprises an operational member with a key operational part, which is exposed outside of the housing through an opening formed in the housing, and the thermally conductive member supports the operational member in the housing.

EFFECT OF THE INVENTION

According to the present invention, a thermally conductive member is arranged opposite to the circuit board, on which an electronic component is mounted, and the thermally conductive member forms at least a part of the battery chamber, so that the heat from the heating component on the circuit board can be efficiently transferred to the battery via the thermally conductive member, and absorbed by the battery. Thus, heat dissipation from the heating component can be ensured.

DESCRIPTION OF EMBODIMENTS

Preferred embodiments of the present invention will now be described with reference to the accompanying drawings.

FIG. 1 shows a perspective view of a key side housing of a cellular phone as an example of a portable electronic apparatus according to an embodiment of the present invention.

As shown in FIG. 1, the key side housing 1 of the cellular phone forms a fold type cellular phone, cooperating with an indicator side housing (not shown) which is attached by a hinge 2 on one end of the key side housing 1. The key side housing 1 is formed by putting a key front case 3 and key rear case 4 on top of one another, and the key front case 3 has a key operational part (not shown) exposed to the outside of the housing 1 through an opening which is formed in the key front case 3. On the key front case 3, a key detection unit (not shown) comprising, for example, a metal dome seat and a button key to press the metal dome is mounted to detect an operational state of various operational keys of the operational member.

FIG. 2 is a perspective view showing the internal structure of the key side housing 1 of FIG. 1. FIG. 2 shows a state in which a key rear case 4 is removed, and the internal surface of the key front case 3 is exposed.

As shown in FIG. 2, inside the key side housing 1, i.e., on the inner surface of the key front case 3 forming the key side housing 1, a flexible substrate 5 having a key operational part and a key detection unit (not shown) of the key operational part, a covering member 6 (shield case) functioning as a thermally conductive member, and a circuit board 7 are layered toward the key rear case 4, which is to be put on top of the key front case 3, in other words, in order from bottom to top in the FIG. 2. The covering member 6 preferably supports the operational member on the side of the key front case 3.

In addition, the covering member 6 is arranged to shield a surface on one side of the circuit board 7 to block an electromagnetic wave emitted from a electronic component mounted on the surface on one side of the circuit board 7 (lower surface shown in FIG. 4), or entered from outside.

The circuit board 7 is arranged in the housing in such a manner that it occupies an approximate half region of the key front case 3 on the side of the hinge 2, and a battery chamber 8 in which a battery (not shown) is accommodated, is defined in the remaining region of the key front case 3. The battery accommodated in the battery chamber 8 is arranged opposite to the covering member 6 on a side where the circuit board 7 is facing to the covering member 6 functioning as a thermally conductive member.

Further, the circuit board 7 that is arranged adjacent to the battery chamber 8 on the side of the hinge 2 has a battery connector 9 electrically connected to the battery. Various electronic components such as a converter, a power amplifier or the like are mounted on the surface of the circuit board 7. These electronic components include a plurality of heating components. Reference numeral 11 indicates a cover to close a card mounting opening of a card connector 10, which is arranged in the key side housing 1 and on which an external memory card can be mounted.

The covering member 6, which is arranged opposite to the circuit board 7 and the battery chamber 8, is formed by a component with high heat conductivity, for example a sheet metal or a metal component of aluminum and the like. FIG. 3 shows only the covering member 6. The covering member 6 is formed by a plate body 6a having a planar face arranged opposed to the circuit board 7, and a frame body 6b defining a chamber 8 of a battery (not shown). Thus, the heat from heating components, which are mounted opposite to the plate body 6a on one surface of the circuit board 7, is absorbed by the covering member 6 as a thermally conductive member, and reliably transferred to the battery chamber 8 via the covering member 6, and finally to the battery accommodated in the battery chamber 8, and dissipated therefrom.

In addition, the covering member 6 is composed of a metal material, and is arranged such that it functions as a shield case to cover or shield the electronic component (heating component) mounted opposite to the plate body 6a on the one surface of the circuit board 7, and shields an electromagnetic wave from outside or from the electronic components. The covering member 6 is further contacted with a ground (a reference potential part), at least a part of the ground being arranged opposite to the plate body 6a on the one surface of the circuit board 7, and electrically connected (conducted) to the ground. Thereby, effects such as an electrostatic measure can be obtained.

The covering member 6 has to serve as a heat sink and a holder for holding the circuit board 7 and the flexible substrate 5 at the same time. It is desirable to use a light and rigid component composed of aluminum alloy or magnesium alloy, but stainless steel or common steel can be also used.

FIG. 4 schematically shows an arrangement of the heating component 12, the circuit board 7, the covering member 6, and the battery 13 in the battery chamber 8 to each other, which are mounted on one surface of the circuit board 7 opposite to the plate body 6a in the key side housing 1 shown in FIG. 1 to FIG. 3, and the heat dissipation route from the heating component will be described in detail.

Firstly, as shown in FIG. 5, which is an enlarged view of the heat dissipation route from the heating component 12 on the circuit board 7 shown in FIG. 4, the heating component 12 is contacted with the covering member 6 (plate body 6a) arranged opposite to the circuit board 7 via rectangular rib 6c (see FIG. 3), and the heat from heating component 12 is transferred to the covering member 6. The heat is then absorbed from a part of the covering member (frame body 6b) 6, which defines and forms the battery chamber 8, by the battery 13 accommodated in the battery chamber 8, and finally dissipated via the battery 13.

Thus, owning to the heat dissipation from the side of battery 13, the heat from the heating component is not only transferred to the covering member 6, and dissipated from the operational surface in a conventional way, but also from the back side of the housing where the battery is arranged, so that an efficient and enhanced heat dissipation can be obtained.

In an example shown in FIG. 5, the covering member 6 is provided with a rib 6c projecting toward the circuit board 7 on the surface opposed to the circuit board 7. The rib 6c is arranged in rectangular shape in a position corresponding to the circumference of the heating component 12. The heating component 12 mounted on the surface on one side of the circuit board 7 is contacted with the covering member 6 via the rib 6c, and surrounded by the rib 6c, so that the heat is transferred from the heating component 12 to the covering member 6 more effectively. The heating component 12 can be only adapted to contact with the covering member 6. Since the covering member 6 is arranged oppose to the heating component 12, the heat from the heating component 12 is transferred to the covering member 6, even if the heating component 12 is not contacted with the covering member 6.

If the heating component 12 is thinner than other electronic components, the rib 6d formed on the inner surface (upper surface in FIG. 6) of the plate body 6a of the covering member 6 is contacted with the back surface (lower surface in FIG. 6) of the heating component 12 as shown in 6, so that the heat is transferred from the heating component 12 to the covering member 6.

Further, if the heat of the heating component 12 is dissipated from the battery 13, the heating component 12 is preferably arranged closer to the battery 13 (on the right side in FIG. 4) relative to other electronic components on the circuit board 7 with no or little heat dissipation. In that case, if the connector 9 of the battery 13 is arranged in a cutout of the circuit board 7 as shown in FIG. 4, the heating component 12 is preferably arranged closer to the battery 13, avoiding the connector 9.

More specifically, if the connector 9 is arranged on the one side in a traverse direction of the housing of the circuit board 7 as shown in FIG. 2, the electronic components with relatively high heating properties are arranged closer to the battery 13 on that one side, so that the heat transfer route from the heating component 12 to the battery 13 is shortened and heat dissipation property is improved.

FIG. 7 (a) is a cross-sectional view perpendicular to a cross-sectional view shown in FIG. 4, and FIG. 7 (b) is a plan view of arrangement of each component according to another embodiment. A heating component 12a is also mounted on the surface on the circuit board 7 opposed to the surface facing the covering member 6, and a card connector 10 is arranged opposite to the heating component 12a in the housing.

The card connector 10 is mounted on a flexible substrate 14 formed integrally with a flexible substrate (not shown) mounted on the surface of the covering member 6 (lower surface shown in FIG. 7 (a)), and between the heating component 12a and the covering member 6, the flexible substrate 14 is disposed as a heat sink to form a heat transfer route therebetween.

In other words, the flexible substrate 14 has a high heat conductivity suitable for the present invention, and the heat from the heating component 12a can be efficiently transferred via the flexible substrate 14 to the covering member 6 as a thermally conductive member, and further, the heat dissipation to the battery 13 via the covering member 6 is possible via the same heat transfer route stated above.

For a thermally conductive member between the heating component 12a and the covering member 6, other thermally conductive members such as a sheet metal plate or a copper film plate can be also used to transfer the heat generated form the heating component 12a to the covering member 6. The heat generated from the heating component 12a is not only transferred to the battery 13 via the flexible plate 14 and the covering member 6, and then dissipated therefrom, but also absorbed by the card connector 10 mounted on the flexible substrate and dissipated from the card connector 10.

In the present invention, deterioration of a battery by the heat is a matter of concern, since the heat is dissipated on the battery side. By way of example only, if a lithium ion battery is used as a battery, and the battery is exposed to a high-temperature environment when the charge of the battery is high, the battery can be deteriorated. In order to provide a measure for such a case, the portable electronic apparatus comprises a charge control unit for controlling the charge of the battery, and a temperature detection unit (temperature sensor) for detecting temperature of a battery or temperature near the battery (battery receiver), and the charge control unit preferably provides a control to inhibit the charge of the battery, if a temperature detected by the temperature detection unit is not less than a predetermined temperature. The charge control unit is formed by electronic components mounted on the circuit board 7 and the like.

As stated above, since the portable electronic apparatus transfers the heat from the heating component to the thermally conductive member (the covering member) forming at least a part of the battery chamber, and dissipates the heat on the battery side via the thermally conductive member (the covering member), in particular, the circuit board, on which an electronic component such as a heating component is mounted, is arranged opposite to the thermally conductive member (the covering member) forming at least a part of the battery chamber. The effectiveness of the heat dissipation structure of the invention will now be clarified in comparison with the conventional heat dissipation structure shown in FIG. 8 to FIG. 9.

In other words, in the heat dissipation structure shown in FIG. 8 a heat sink 15 is disposed between the heating component 12 and the covering member 6, and the heat is transferred from the heating component 12 to the covering member 6 via the heat sink 6. In general, a plastic material is used to provide a lightweight covering member 6 with low cost, and a film for shielding an electronic wave is applied on the surface on the side of the circuit board to shield the electronic wave. With this structure, it is not possible to enhance the heat dissipation effect, since the heat is dissipated only from an operational surface, on which an operational key and the like are arranged. With this structure, heat conductivity is low and the heat is not easily dissipated, since a main resin case forming a battery receiver is interposed on the battery side.

In the heat dissipation structure shown in FIG. 9, although the heat from an heating component 12 is transferred to a heat sink 15 through the covering member 6, so that the heat can be dissipated on the side of the operational key, the heat conductivity is low on the battery side and the heat is not easily dissipated, since the main resin case forming the battery receiver is interposed.

Further, according to the structures shown in FIG. 8 and FIG. 9, the circuit board 7 is arranged over the whole internal area of a housing, and the circuit board 7 and the battery 13 are arranged in an overlapping position in a direction of the thickness of the housing, resulting in a thick structure of the whole apparatus.

In the heat dissipating structure in FIG. 10, as a thermally conductive member, the heat sink 15 is provided opposite to the electronic components 12 on the circuit board 7 as in FIG. 8 and FIG. 9, and the heat sink 15 extends to a position opposed to the battery 13 and defines a part of the battery chamber. The heat from the heating component 12 is transferred to the heat sink 15 via the covering member 6 for covering the heating component 12, and the transferred heat is not only dissipated on the side of the operational key, but also transferred to the battery 13 and dissipated from the battery side, so that the heat dissipation is provided over the whole housing and the heat can be dissipated effectively and thus, a locally high temperature of the housing can be avoided.

The present invention has been described according to the embodiments above, but is not limited to these embodiments. Thus, the present invention includes variations embodied within a scope of the invention. For example, the embodiments above are described with respect to a fold type cellular phone, while the invention can be also applied for other types of cellular phones, an information-communication terminal such as PDA (Personal Digital Assistant), an electronic apparatus such as PCs (Personal Computer) or the like.

By way of an example only, in the embodiments above, the covering member 6 as a thermally conductive member is arranged opposite to the surface on one side of the circuit board 7 and formed by a metal member such as a sheet metal or aluminum, but it is not limited to the embodiments described above and includes members which absorb the heat generated from the electronic components 12 on the circuit board 7 and transfers the heat toward the battery 13.

A thermally conductive member is not limited to the covering member 6 for covering electronic components 12 on a circuit board 7 as described in the embodiments above, but includes members arranged opposite to the circuit board 7 and absorbing the heat from the electronic components.

While the circuit board 7 is arranged on the side of the hinge 2 of the key side housing 1, and the battery 13 is arranged on the opposite side of the hinge 2, so that the circuit board 7 and the battery 13 are arranged adjacent to each other in a direction of the housing, the structure of the circuit board 7 and the battery 13 is not limited to this, but includes structures, in which the heat from the electronic components 12 on the circuit board 7 is transferred to the thermally conductive member (the covering member 6) arranged opposite to the circuit board 7, and then to the battery 13 via the thermally conductive member.

As in the embodiments above, a thin housing can be obtained by arranging the circuit board 7 and the battery 13 adjacent to each other in a longitudinal direction of the housing, so that the whole housing can be miniaturized. As shown in FIG. 4 to FIG. 6, the connector 9 and the battery 13 are arranged on the same member on the circuit board 7, so that the relationship between the positions of the battery 13 and the connector 9 can be preferably maintained and an electric connection between the battery 13 and the connector 9 can be assured.

DESCRIPTION OF REFERENCE NUMERALS

Figure 1:
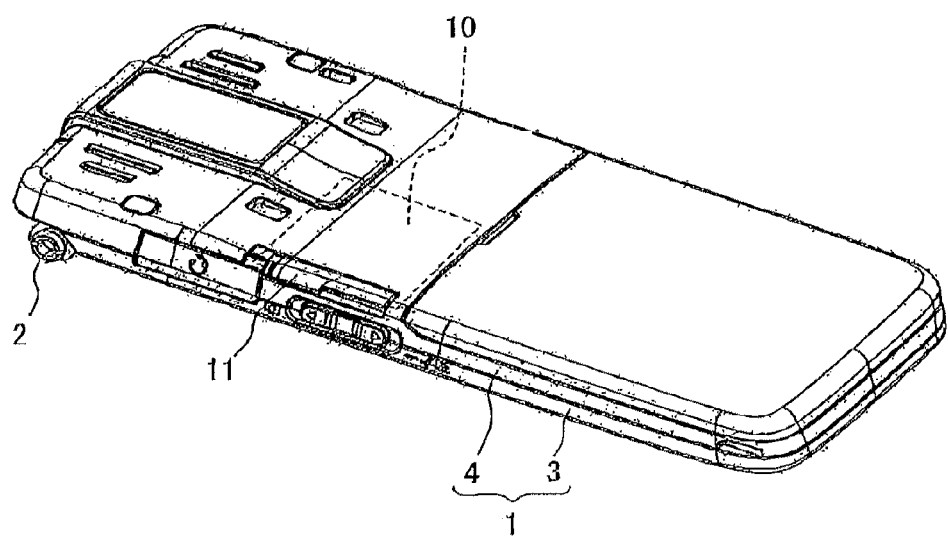
FIG. 1 is a perspective view of a portable electronic apparatus according to an embodiment of the present invention.
Figure 2:
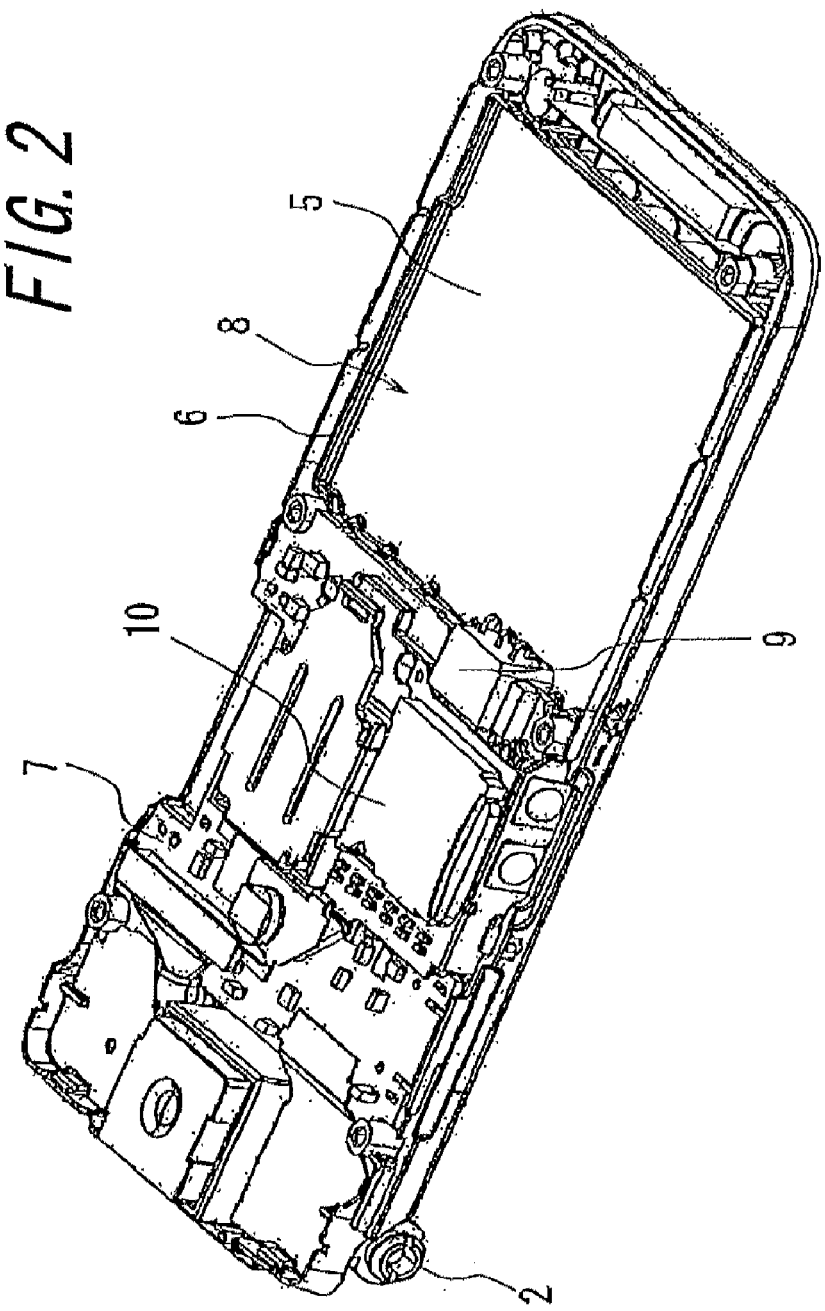
FIG. 2 is a perspective view showing internal structure of the key side housing of FIG. 1.
Figure 3:
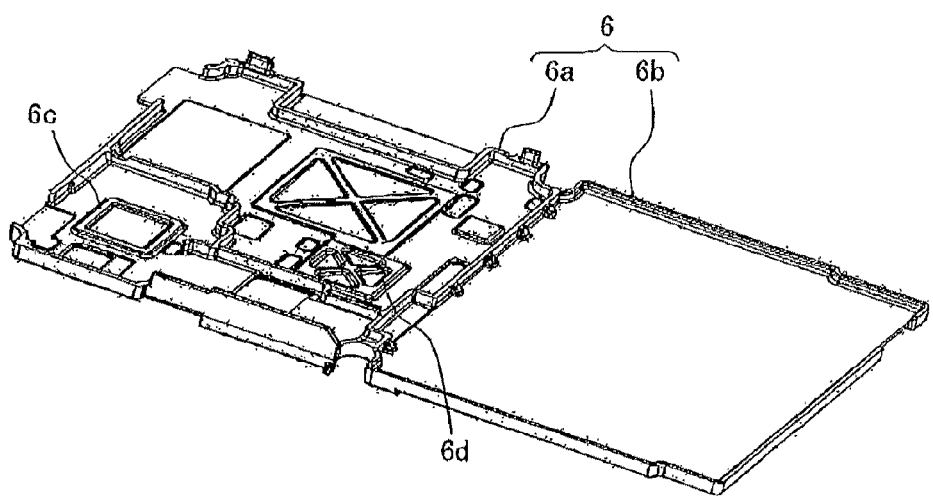
FIG. 3 is a perspective view of a covering member.
Figure 4:
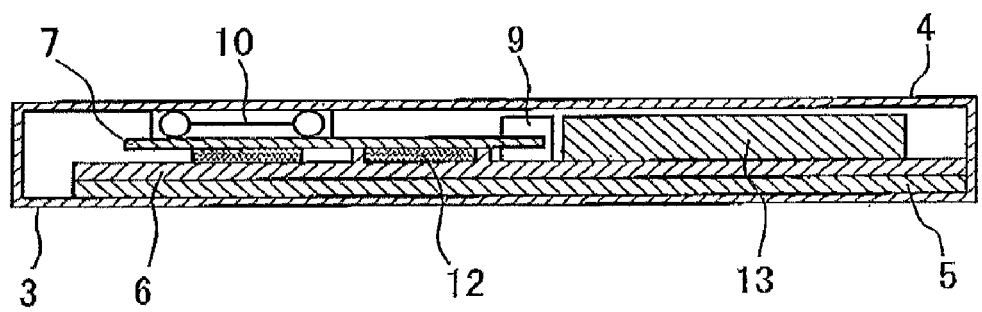
FIG. 4 is a schematic side view showing the relative arrangement of heating component, a circuit board, a covering member and a the battery.
Figure 5:
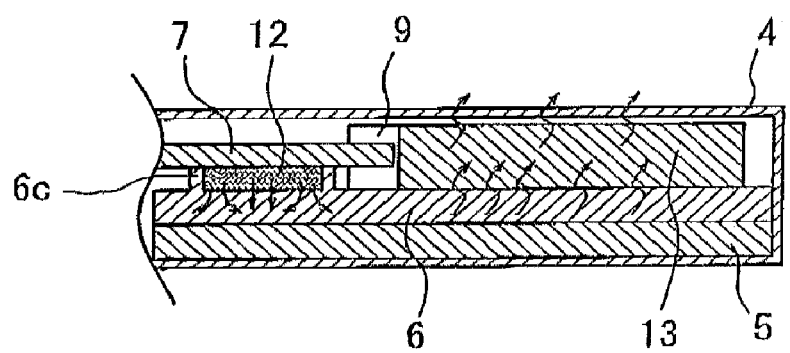
FIG. 5 is a side view showing a heat transfer route from heating component.
Figure 6:
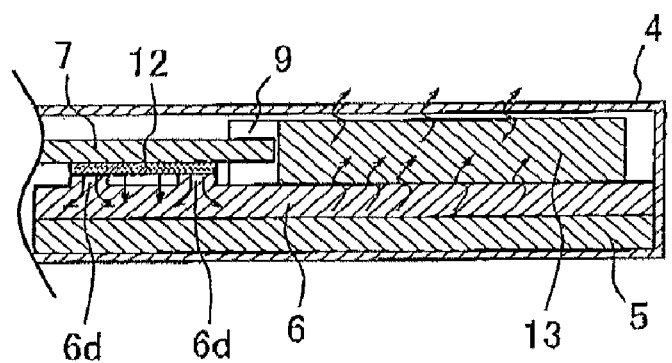
FIG. 6 is another side view showing a heat transfer route from heating component.
Figure 7:
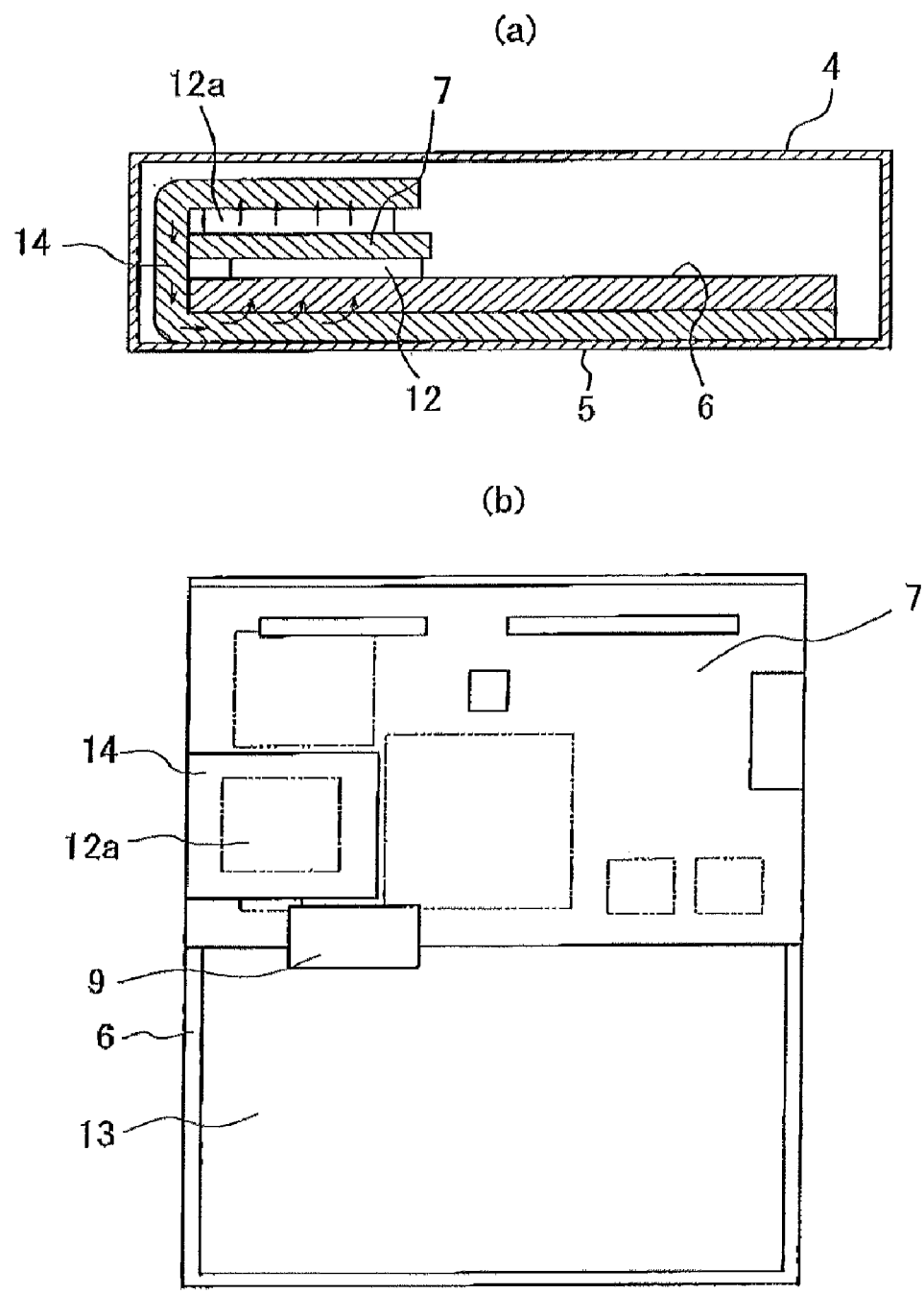
FIG. 7 (*a*) is a cross-sectional view and FIG. 7(*b*) is a plan view of another embodiment.
Figure 8:
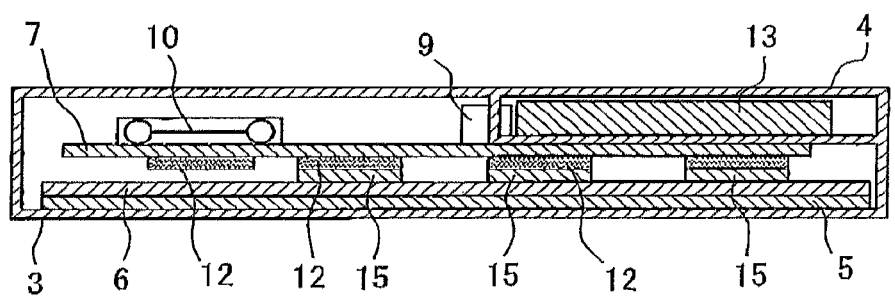
FIG. 8 is a side view of a heat transfer structure in a conventional portable electronic apparatus.
Figure 9:
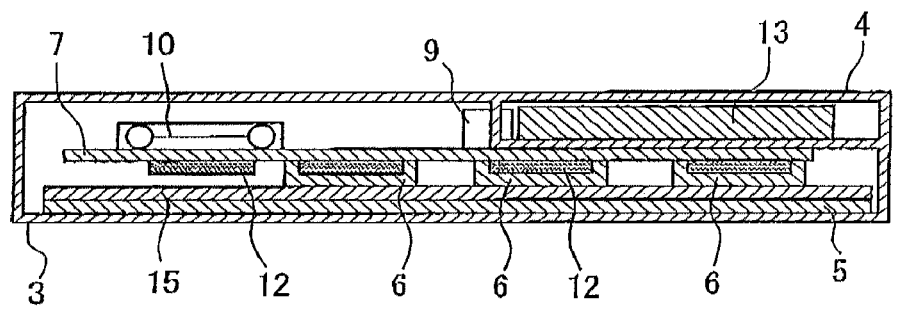
FIG. 9 is another side view of a heat transfer structure in a conventional portable electronic apparatus.
Figure 10:
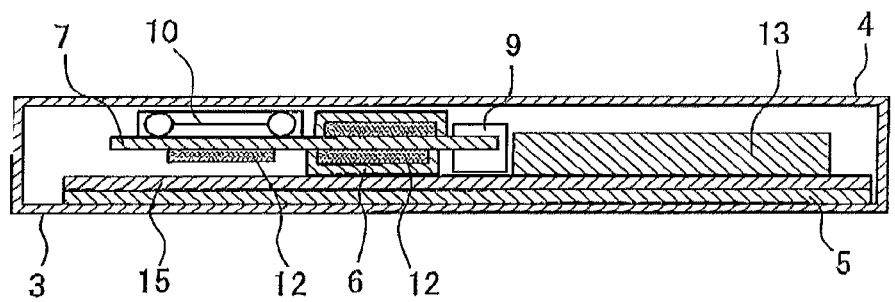
FIG. 10 is another side view of a heat transfer structure in an portable electronic apparatus according to an exemplary embodiment of the invention.

1 indicator side housing
2 hinge
3 key front case
4 key rear case
5 flexible substrate
6 covering member
7 circuit board
8 battery chamber
9 battery connector
10 card connector
12 heating component
13 battery
14 flexible substrate

The invention claimed is:
1. A portable electronic apparatus comprising:
 a housing;
 a circuit board accommodated in the housing and mounted with an electronic component on one surface on one side;
 a thermally conductive member arranged opposite to the surface on one side of the circuit board and having thermally conductive property, wherein a rib is formed on the thermally conductive member, such that it surrounds the electronic component mounted on the surface on one side of the circuit board;
 and a battery accommodated in a battery chamber formed in the housing, wherein the thermally conductive member forms at least a part of the battery chamber.

2. The portable electronic apparatus according to claim 1, wherein the thermally conductive member is arranged opposite to the surface on one side of the circuit board and is formed by a covering member for covering the electronic component.

3. The portable electronic apparatus according to claim 2, wherein the covering member has electric conductivity, and is electrically connected with a reference potential part arranged on the circuit board.

4. The portable electronic apparatus according to claim 1, wherein the thermally conductive member is contacted with the electronic component mounted on the surface on one side of the circuit board.

5. The portable electronic apparatus according to claim 1, wherein the circuit board has an electronic component mounted on a surface on the other side opposite to the surface on one side, and the thermally conductive member has a thermally conductive part that is arranged opposite to the electronic component mounted on the surface on the other side of the circuit board.

6. The portable electronic apparatus according to claim 1, wherein the battery is arranged opposite to the thermally conductive member on a side where the circuit board is arranged opposed to the thermally conductive member.

7. The portable electronic apparatus according to claim 1, wherein the thermally conductive member has a planar face arranged opposite to the circuit board, and the battery is arranged adjacent to the circuit board in a direction of the planar face.

8. The portable electronic apparatus according to claim 1, wherein the circuit board comprises a plurality of electronic components mounted on the surface on one side, and wherein an electronic component with relatively high heating property among the plurality of electronic components is arranged closer to the battery relative to the other electronic component on the surface on one side of the circuit board.

9. The portable electronic apparatus according to claim 1, wherein the portable electronic apparatus further comprises:
 a charge control unit for controlling a charge of the battery; and
 a temperature detection unit for detecting temperature of the battery or temperature near the battery, and, if the temperature detected by the temperature detection unit is not less than a predetermined temperature, the charge control unit performs control to inhibit the charge of the battery.

10. The portable electronic apparatus according to claim 1, wherein the portable electronic apparatus further comprises an operational member with a key operational part, which is exposed outside of the housing through an opening formed in the housing, and the thermally conductive member supports the operational member in the housing.

* * * * *